United States Patent
Birdsley et al.

(10) Patent No.: US 6,806,166 B1
(45) Date of Patent: Oct. 19, 2004

(54) SUBSTRATE REMOVAL AS A FUNCTION OF EMITTED PHOTONS AT THE BACK SIDE OF A SEMICONDUCTOR CHIP

(75) Inventors: Jeffrey D. Birdsley, Austin, TX (US); Michael R. Bruce, Austin, TX (US); Rama R. Goruganthu, Austin, TX (US); Brennan V. Davis, Austin, TX (US); Rosalinda M. Ring, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 547 days.

(21) Appl. No.: 09/379,047

(22) Filed: Aug. 23, 1999

(51) Int. Cl.[7] .......................... H01L 21/30; H01L 21/46
(52) U.S. Cl. ........................... 438/459; 438/14; 438/16
(58) Field of Search .................... 438/14, 15, 16, 438/107, 108, 459, 613, 612; 257/723, 778, 666, 698

(56) References Cited

U.S. PATENT DOCUMENTS

| | | | | |
|---|---|---|---|---|
| 5,895,972 A | * | 4/1999 | Panicia | 257/706 |
| 5,930,588 A | * | 7/1999 | Panicia | 438/16 |
| 5,963,781 A | * | 10/1999 | Winer | 438/14 |
| 6,112,004 A | * | 8/2000 | Colvin | 385/116 |
| 6,355,494 B1 | * | 3/2002 | Livengood et al. | 438/14 |

* cited by examiner

*Primary Examiner*—Maria Guerrero

(57) ABSTRACT

According to an example embodiment of the present invention, a portion of substrate in the back side of a semiconductor chip is removed as a function of photons emitted through substrate remaining at the back side. The use of emitted photons is used to control the substrate removal process.

19 Claims, 3 Drawing Sheets

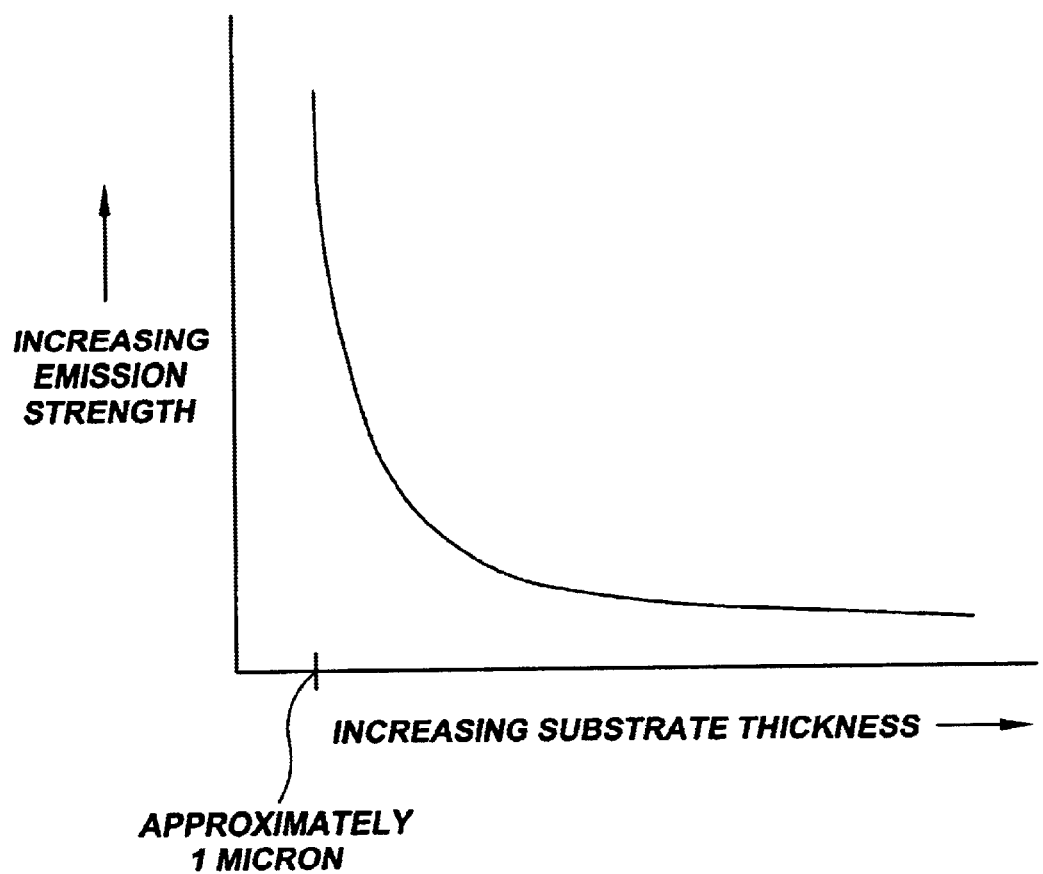

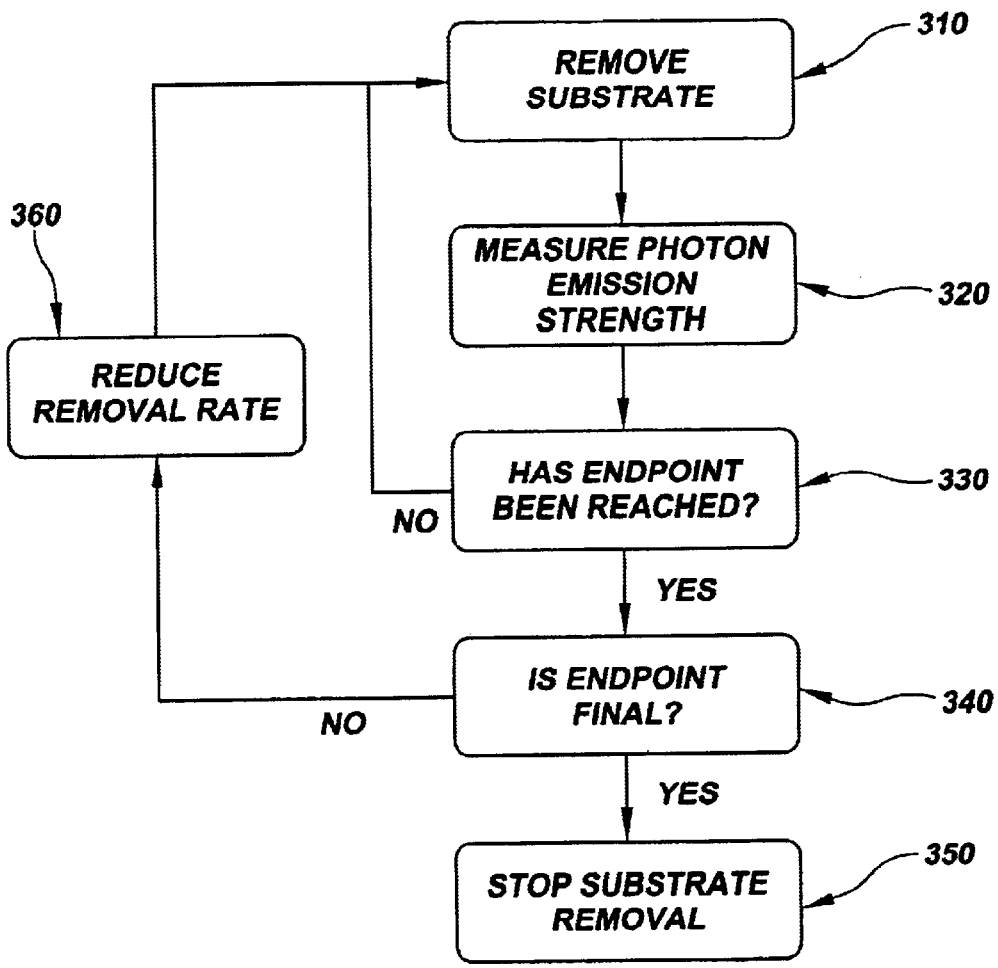

SUBSTRATE REMOVAL AS A FUNCTION OF EMITTED PHOTONS AT THE BACK SIDE OF A SEMICONDUCTOR CHIP

FIELD OF THE INVENTION

The present invention relates generally to semiconductor chips and their fabrication and, more particularly, to semiconductor chips and their manufacture involving substrate removal.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

To increase the number of pad sites available for a die, to reduce the electrical path to the pad sites, and to address other problems, various chip packaging techniques have been developed. One of these techniques is referred to as controlled collapse chip connection or "flip-chip" packaging. With packaging technology, bonding pads of the die include metal (solder) bumps. Electrical connection to the package is made when the die is "flipped" over and soldered to the package. Each bump connects to a corresponding package inner lead. The resulting packages are low profile and have low electrical resistance and a short electrical path. The output terminals of the package, which are sometimes ball-shaped conductive bump contacts, are typically disposed in a rectangular array. These packages are occasionally referred to as "Ball Grid Array" (BGA) packages. Alternatively, the output terminals of the package may be pins and such packages are commonly known as pin grid array (PGA) packages.

Once the die is attached to such a package the back side portion of the die remains exposed. The transistors and other circuitry are generally formed in a very thin epitaxially-grown silicon layer on a single crystal silicon wafer from which the die is singulated. The side of the die including the epitaxial layer containing the transistors, and the other active circuitry is often referred to as the circuit side of the die or front side of the die. The circuit side of the die is positioned very near the package. The circuit side opposes the back side of the die. Between the back side and the circuit side of the die is single crystalline silicon.

The positioning of the circuit side near the package provides many of the advantages of the flip chip. However, in some instances orienting the die with the circuit side face down on a substrate is disadvantageous. Due to this orientation of the die, the transistors and circuitry near the circuit side are not directly accessible for testing, modification or other purposes. Therefore, access to the transistors and circuitry near the circuit side is from the back side of the chip.

In order to access desired circuitry within the device, it is helpful to "view" the circuitry to determine its location. Viewing the circuitry within the chip via the back side using optical or scanning electron microscopy is blocked by the bulk silicon. Infrared (IR) microscopy, however, is capable of imaging the circuit through the silicon because the silicon is relatively transparent in these wavelengths of the radiation. To acquire these images, because of the absorption losses of IR radiation in silicon, it is generally required to thin the die to less than 100 microns. For example, on a die that is 725 microns thick, at least 625 microns of silicon is typically removed before IR microscopy can be used. Thinning the die for failure analysis of a flip chip bonded IC is usually accomplished by first thinning the die across the whole die surface, often referred to as global thinning. Mechanical polishing, such as chemical-mechanical polishing (CMP), is one method for global thinning.

Once an area is identified using IR microscopy as an area of interest and it is determined that access is needed to a particular area of the circuit, local thinning techniques are often used to thin an area smaller than the die size. One method of local thinning, referred to as laser microchemical etching, is typically accomplished by focusing a laser beam on the back side of the silicon surface to cause local melting of silicon in the presence of chlorine gas. The molten silicon reacts very rapidly with chlorine and forms silicon tetrachloride gas, which leaves the molten (reaction) zone. This is a silicon removal process used in connection with the 9850 SiliconEtcherm™ tool by Revise, Inc. (Burlington, Mass). This laser process is suitable for both local and global thinning by scanning the laser over a part or whole surface of the die.

Sometimes it is helpful for failure analysis, or for design debug, to make electrical contact and probe certain nodes in the circuit that is on the circuit side or front side of the die, or to reconfigure the conductors in an integrated circuit. This access is generally done by milling through the die to access the node, or milling to the node and subsequently depositing a metal to electrically access the node. These access holes need to have high aspect ratios. Milling through silicon with fairly high aspect ratio trenches is slow and almost impractical for silicon thickness greater than 10 microns. For these reasons, it is necessary to have a method and apparatus which will provide for controlled thinning of flip chip bonded IC devices to less than 10 micron thickness. In particular, it is important to have the ability to determine the endpoint of the removal process with sufficient accuracy to avoid milling off the node to which access is being sought, which could often jeopardize further device analysis. The endpoint may be a preliminary or final endpoint of the removal process.

Therefore, the introduction of flip chip technology requires a method and apparatus for determining the thickness of silicon between a portion of the active circuitry near the circuit side of the die and the back side of the die. This is necessary to eliminate any guesswork as to the thickness of the silicon while the back side of the die is being removed. If this guesswork is eliminated, failure analysis and debugging of the circuitry associated with a particular integrated circuit is facilitated. Furthermore, when the position of the circuitry is known or can be determined from the back side removal of the silicon, getting to the circuitry can be accomplished in less time.

SUMMARY OF THE INVENTION

The present invention is exemplified in a number of implementations and applications, some of which are summarized below. According to an example embodiment, the present invention is directed to a method for removing substrate from a semiconductor chip having a circuit side including active circuitry and a back side including silicon substrate. A portion of substrate in the back side of the semiconductor chip is removed as a function of photons emitted through substrate remaining at the back side.

According to another example embodiment of the present invention, substrate is removed from a semiconductor chip including a circuit side having active circuitry and a back side having silicon substrate. The photon emission strength of the active circuitry is measured, and substrate is removed from the back side of the semiconductor chip until a photon emission strength corresponding to a checkpoint is detected. In response to detecting the checkpoint, the substrate removal rate is adjusted. Substrate is again removed at the adjusted removal rate until a photon emission strength corresponding to another checkpoint is detected, and the process of measuring the photon emission strength, detecting a checkpoint, and adjusting the removal rate is repeated until a final checkpoint is detected. In response to detecting the final checkpoint, the removal process is terminated.

According to another example embodiment, the present invention is directed toward a system for removing substrate from a semiconductor chip having a circuit side and a back side, wherein the back side has silicon substrate. The system includes means for removing substrate from the back side of the semiconductor chip, means for measuring the photon emission strength of the chip, and means for controlling the means for removing substrate in response to a measured photon emission strength.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 2 is a graph showing emission strength versus substrate thickness of a semiconductor device, according to an example embodiment of the present invention; and FIG. 3 is an example flow diagram of a process for endpoint detection in a semiconductor chip, according to another example embodiment of the present invention.

Figure 1:
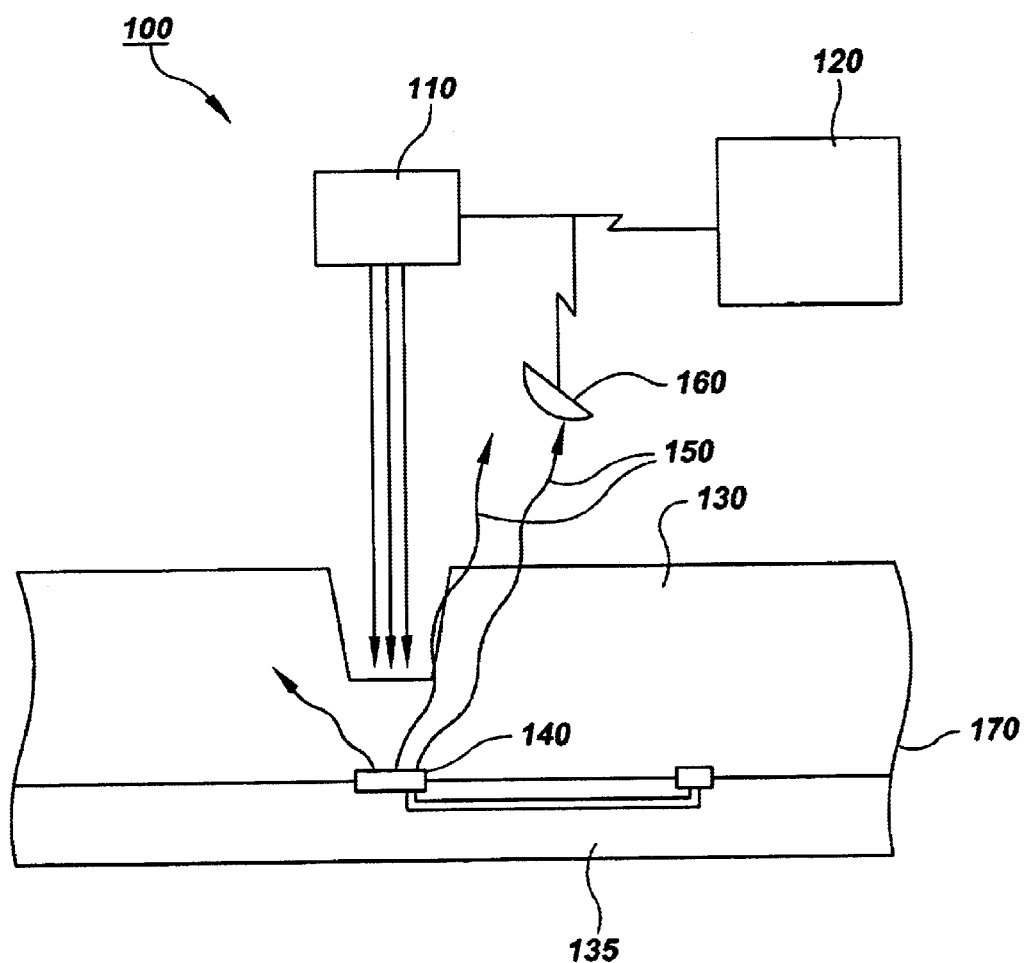
FIG. 1 illustrates a side view of a semiconductor having substrate removed, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and the invention has been found to be particularly suited for devices requiring or benefiting from back side milling and exposure of device circuitry. While the present invention is not necessarily limited to such devices, various aspects of the invention may be appreciated through a discussion of various examples using this context.

According to an example embodiment of the present invention, substrate is removed from the back side of a semiconductor flip-chip, and the remaining back side substrate acts as a photon filter, affecting the photon emission strength. The chip is powered, and photons are emitted as a result of activity within circuitry in the semiconductor chip. In connection with the present invention it has been discovered that, as substrate in the back side of the chip is removed, the filter effectiveness decreases, and the photon emission strength increases. The photon emission strength is measured, and the measurement provides an indication of the thickness of the substrate over the circuitry within the chip. The substrate removal process is controlled in response to the measured photon emission strength.

For example, when the substrate thickness is less than about one micron, the photon emission strength increases almost infinitesimally. In response to this increase in emission strength, the substrate removal process may be stopped, or the increase may provide at least an indication of the imminent approach of the desired endpoint. This allows the substrate removal process to proceed at a high rate until the endpoint of the process is nearly reached, and then slow for the final substrate removal.

In a particular example implementation, the substrate emits at energy levels less than 1.1 ev, corresponding to a wavelength of emitted photons of less than about 1100 nanometers. In another particular implementation, the control of the removal process, including the removal rate and the extent of substrate removal, is accomplished using a programmed computer arrangement.

According to a more specific example embodiment of the present invention, substrate is removed from the back side of a semiconductor flip-chip at a first removal rate using a laser-chemical etcher at a first power level. The photon emission strength is monitored and substrate is removed until reaching a first threshold level, wherein the first threshold level is defined as a function of the flip-chip and the monitored emission strength. The first threshold level may, for instance, correspond to approaching a final endpoint of the removal process. After the first threshold level is reached, the laser-chemical etcher is set at a second power level and substrate is removed at a second removal rate. The photon emission strength is again monitored, and substrate is removed until reaching a second threshold level, wherein the second threshold level is defined as a function of the flip-chip and the monitored emission strength.

FIG. 1 shows a system 100 for milling the back side 130 of a semiconductor chip 170, according to another example embodiment of the present invention. In this example illustration, the chip 170 is a flip chip. The system includes a milling device 110 for milling the back side 130. In a specific example embodiment, the milling device 110 includes at least one of: a laser etching device, FIB device, chemical-mechanical polishing device, an ion bombardment device, or other similar device. The semiconductor chip 170 has circuitry 140 near a circuit side 135 that emits photons 150 through the back side 130. The circuitry 140 may include various circuit devices such as MOS-type transistors. The back side 130 acts as a filter, wherein the effectiveness of the filter can be correlated to the thickness of the back side, such that the photon emission strength increases with the removal of substrate in the back side. FIG. 2 shows an example representation of this correlation of the photon emission strength to the substrate thickness.

A measurement device 160 is used to detect the strength of the emitted photons 150. The measurement device 160 may include devices such as a near-infrared detector or a silicon based detector and is coupled to a processor 120. The processor 120 is programmed to interpret the measured emission strength and to provide a control for the milling process, and may include a computer arrangement for interpreting the measured photon emission strength and for controlling the milling process.

Removing substrate, measuring emission strength, and correlating the measured emission strength for use in controlling the substrate removal can be accomplished in several manners and combinations depending upon the application and available resources. For instance, an apparatus is provided that has the capability to remove substrate, measure photon emission strength, determine the remaining substrate thickness by correlating the measured emission strength to substrate thickness, and control the substrate removal process based on the determined substrate thickness. In another instance, an apparatus is implemented to measure the emission strength and generate a control signal for use by a separate substrate removal device. In yet another instance, an apparatus is implemented to measure emission strength, correlate that emission strength and provide an indication of the remaining substrate thickness. The correlated substrate thickness can be used directly by an operator or transferred electronically to a control device, and subsequently used to determine how to control the substrate removal process.

According to another example embodiment, and referring to FIG. 3, the present invention includes a method for endpoint detection. At block 310, substrate is removed from a semiconductor chip, wherein the chip has a circuit side and a back side, and wherein the back side includes silicon substrate. The photon emission strength is measured at block 320. Based on the measured photon emission strength, it is determined whether the endpoint has been reached at block 330. If the endpoint has not been reached, the process continues at block 310. If the endpoint has been reached, it is determined whether the endpoint is final at block 340. If the endpoint is final, the substrate removal process is stopped at block 350. If the endpoint is not final, the substrate removal rate is reduced at block 360, and the process continues at block 310. The emission strength corresponding to a final endpoint varies with the device under test. Factors determining the emission strength for a switching device, for example, typically include the speed of the switching device, the current and voltage levels at which the device is excited, and the overall design of the device.

While the present invention has been described with reference to several particular example embodiments, those skilled in the art will recognize that many changes may be made thereto without departing from the spirit and scope of the present invention, which is set forth in the following claims.

What is claimed is:

1. A method for removing substrate from a semiconductor chip having a circuit side including active circuitry and a back side including silicon substrate, the method comprising removing a portion of substrate in the back side of the semiconductor chip as a function of photons emitted through substrate remaining at the back side.

2. The method of claim 1, further comprising measuring the photon emission strength by detecting the photons emitted through the remaining substrate.

3. The method of claim 2, further comprising controlling the substrate removal responsive to the measured photon emission strength.

4. A method for removing substrate from a semiconductor chip having a circuit side including active circuitry and a back side including silicon substrate, the method comprising removing a portion of substrate in the back side of the semiconductor chip as a function of photons emitted through substrate remaining at the back side wherein removing a portion of substrate in the back side of the semiconductor chip as a function of photons emitted through substrate remaining at the back side comprises:

removing a portion of substrate in the back side of the semiconductor chip and forming a measurement region;

measuring the photon emission strength at the measurement region by detecting photons emitted through the remaining substrate; and controlling the substrate removal responsive to the measured photon emission strength.

5. The method of claim 4, wherein measuring photon emission strength includes measuring photons emitted from an active MOS-type device.

6. The method of claim 4, wherein measuring includes using at least one of: a near-IR detector and a silicon-based detector.

7. The method of claim 4, wherein the substrate passes emitted photons as a function of the substrate thickness.

8. The method of claim 4, wherein controlling the substrate removal includes programming a computer arrangement to measure the photon emission strength and to provide a control for the substrate removal.

9. The method of claim 4, wherein controlling the substrate removal responsive to the measured photon emission strength comprises:

removing substrate at a first removal rate until a point at which the measured emission strength reaches a first threshold level corresponding to an amount of silicon remaining in the measurement region of the back side;

reducing the removal rate to a second removal rate, responsive to reaching the first threshold level;

removing substrate at the second removal rate until the measured emission strength reaches a second threshold level; and responsive to reaching the second threshold level, stopping the removal process.

10. The method of claim 9, wherein removing substrate at the first removal rate includes removing substrate using a laser-chemical etcher at a first power level.

11. The method of claim 9, wherein the first threshold level corresponds to an emission strength defined as a function of the semiconductor chip under test and the step of measuring.

12. The method of claim 9, wherein removing substrate at the second removal rate includes removing substrate using a laser-chemical etcher at a second power level.

13. The method of claim 9, wherein the second threshold level corresponds to an emission strength defined as a function of the silicon thickness.

14. The method of claim 9, further including using a computer arrangement programmed to respond to the measured photon emission strength, reduce the removal rate, and stop the removal process.

15. The method of claim 9, wherein reaching the first threshold level corresponds to approaching the final endpoint of the removal process.

16. The method of claim 9, wherein the second threshold level corresponds to reaching the final endpoint of the removal process.

17. A method for removing substrate from a semiconductor chip, wherein the chip has a circuit side having active circuitry and a back side having silicon substrate, the method comprising the steps of:
- (A) measuring photon emission strength from the active circuitry;
- (B) removing substrate from the back side of the semiconductor chip at a substrate removal rate until a checkpoint is detected and in response thereto, adjusting the substrate removal rate;
- (C) repeating step B until a final checkpoint is detected; and
- (D) responsive to detecting the final checkpoint, terminating the removal process.

18. A method for removing substrate from a semiconductor chip, the chip having a circuit side and a back side, the back side having silicon substrate, the method comprising:
- removing substrate from the back side of the semiconductor chip;
- measuring the photon emission strength of the chip; and
- controlling the removal of substrate in response to a measured photon emission strength.

19. A method for removing substrate from a semiconductor chip, wherein the chip has a circuit side having active circuitry and a back side having silicon substrate, the method comprising the steps of:
- (A) detecting an emission strength of photons emitted from the active circuitry;
- (B) removing substrate from the back side of the semiconductor chip at a first substrate removal rate until a checkpoint is detected and in response thereto, adjusting the substrate removal rate, the checkpoint being indicative of the detected photon emission strength reaching a first photon emission strength;
- (C) repeating steps A and B until a final checkpoint is detected, the final checkpoint being indicative of the detected photon emission strength reaching a second photon emission strength; and
- (D) responsive to detecting the final checkpoint, terminating the removal process.

* * * * *